United States Patent
Levy (10) Patent No.: US 6,857,101 B1
(45) Date of Patent: Feb. 15, 2005

(54) APPARATUS AND METHOD OF STORING REFERENCE VECTOR OF STATE METRIC

(75) Inventor: Sharon Levy, Tiberias (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/459,598

(22) Filed: Dec. 14, 1999

(51) Int. Cl.$^7$ .............................................. H03M 13/03
(52) U.S. Cl. ........................................ 714/796; 714/792
(58) Field of Search ....................... 714/792, 794–796, 714/746, 786; 375/262, 265, 341

(56) References Cited

U.S. PATENT DOCUMENTS

| | | | | |
|---|---|---|---|---|
| 5,933,462 A | * | 8/1999 | Viterbi et al. | ............... 375/262 |
| 6,028,899 A | * | 2/2000 | Petersen | ..................... 375/262 |
| 6,128,765 A | * | 10/2000 | Ross et al. | ................... 375/285 |
| 6,343,368 B1 | * | 1/2002 | Lerzer | ......................... 714/96 |

FOREIGN PATENT DOCUMENTS

WO    WO 98/20617    5/1998

OTHER PUBLICATIONS

Pietrobon,Steven S.; "Implementation and Performance of a Turbo/MAP Decoder"; Int. J. Satellite Commun.; vol. 16, pp. 23–46; Jan.–Feb. 1998.

* cited by examiner

*Primary Examiner*—Albert Decady
*Assistant Examiner*—Mujtaba Chaudry
(74) *Attorney, Agent, or Firm*—Eitan, Pearl, Latzer & Cohen Zedek, LLP

(57) ABSTRACT

A method of calculating recursive state metric vectors of a block of symbols wherein, the state metric vectors being supplied to an output calculating unit. The method includes calculating the state metric vectors from a first side of the block, and calculating for a second time at least some of the state metric vectors from the first side of the block.

30 Claims, 6 Drawing Sheets

FIG.3
CONTINUATION OF FLOW CHART

APPARATUS AND METHOD OF STORING REFERENCE VECTOR OF STATE METRIC

FIELD OF THE INVENTION

The present invention relates to decoding and in particular to methods for implementing Bahl decoding.

BACKGROUND OF THE INVENTION

Messages transmitted over a wireless medium are encoded in order to reduce the chances that noise will corrupt the message. The encoding translates an original block of an original message which comprises a plurality of bits which are either '0' or '1' to an encoded block which is formed of a plurality of symbols which are either '0' or '1'. The encoding of the block usually includes adding redundancy (i.e., making the encoded block longer than the original block), introducing symbol dependency (i.e., making the value of each symbol in the encoded block a function of a plurality of bits in the original block) and interleaving the block (i.e., mixing the order of the symbols in the encoded block). In modern codes the size of the original block is usually very large, of the order of hundreds, thousands or tens of thousands of bits. Thus, the encoding turns a block of binary bits into a block of binary symbols. It is noted that there is not necessarily a direct correlation between the value of a single bit and the value of any one of the encoded symbols. However, the number of bits in the original block and the number of symbol groups in the encoded block are generally the same. Generally in convolutional codes, bits and symbol groups in corresponding locations within the block are related in that they form pairs of input and output of encoders and decoders, as described hereinbelow.

In convolutional codes, an encoder which has a fixed number of possible states is used to encode the original block. Each bit of the original block which enters the encoder changes a current state of the encoder to a next state according to the value of the entering bit. It is noted that for convolutional codes, from each state the encoder can move only to two other states based on whether the input is '0' or '1'. For each entering bit the encoder generates a group of one or more symbols forming the transmitted message. In other trellis codes, larger inputs are received by the encoder in each iteration, and the number of possible state changes are larger accordingly. In decoding, the decoder assigns each state a state metric (SM), which represents the conditional probability that the encoder was in that state.

During transmission of the message, noise is added to the transmitted encoded message, and a decoder is used to extract the original message from the received message, which includes the noise. Normally, each symbol in the received message is represented in the receiver, before decoding, by a word which represents the chance that the symbol is a logical '1'. A high positive value of the word means that the symbol is a logical '1' with high confidence, while a negative value with a high absolute value means the symbol is a logical '0' with high confidence. A word with a zero value means that the symbol is a '0' or '1' with equal probability. This representation is referred to herein as soft data.

Some decoding methods include one or more iterations of a step of an A-Posteriori probability estimation in which the soft data representation of each symbol is adjusted and/or represented by a hard value (i.e., either '0' or '1') based on the values of other symbols in the block of the adjusted symbol.

Many methods for performing the adjustment step are based on the Bahl algorithm which is described, for example, in Steven S. Pietrobon, "Implementation and Performance of a Turbo/MAP Decoder", Int. J. Satellite Commun, vol. 16, pp. 23–46, January –February 1998, the disclosure of which is incorporated herein by reference. In the Bahl algorithm, for each received symbol group, two vectors of state metrics are prepared; a forward vector which represents the conditional probability of the encoder being in each of the possible states immediately before the symbol group was generated and a backward vector which represents the conditional probability of the encoder being in each of the possible states immediately after the symbol group was generated. The forward vector is calculated based on the received symbols which precede the adjusted symbol group in the block and the backward vector is calculated based on the received symbols which follow the adjusted symbol group in the block. The forward and backward vectors are recursively dependent on the previous state metric vector in the respective directions from the end points of the block.

The forward and backward vectors of each symbol group are supplied concurrently to a log likelihood ratio (LLR) unit which provides an adjusted output value of the symbol group based on the forward and backward vectors and the original value of the symbol group. The output value is chosen according to the most likely transitions between the state metrics of the forward and backward vectors.

After the vectors are supplied to the LLR unit, the vectors may be discarded unless they are needed for calculating vectors of other symbol groups. Therefore, it is preferred, in order to save storage, that the vectors be calculated immediately before they are used. However, due to the recursive nature of the vectors which are calculated from opposite sides of the block, such immediate calculation, usage and discarding is performed in the prior art only in one direction, e.g., in the forward direction.

A conventional prior art method for calculating the output values of all the symbols in a block comprises two passes over the block. In a first pass over the block, performed before the LLR unit begins the adjusting, the backward recursion vectors for all the symbols in the block are calculated and stored. In a second pass over the block, beginning from the opposite end of the block, the forward recursion vectors are calculated, the respective backward recursion vectors are retrieved from the storage and the forward and backward vectors are supplied to the LLR unit. The supplied vectors are immediately used by the LLR unit and then they are discarded.

The storage requirements in this method, required in order to store the backward recursion vectors, are quite large. In order to reduce the required storage space, it has been suggested to perform the symbol adjustments in sub-blocks in which each symbol is influenced only by the symbols in its sub-block, rather than by all the symbols in the block. Such method is described, for example, in PCT publication WO98/20617 the disclosure of which is incorporated herein by reference. The WO98/20617 publication shows that by beginning the recursion calculations from a point sufficiently before the beginning of the sub-block, the recursion values corresponding to the symbols in the sub-block are sufficiently valid although the recursion did not start from the beginning of the block. Even so, the storage requirements for a 16-state code, using 10-bit state metrics for blocks of 40 symbols, is 6400 bits. When implementing a hardware decoder such an amount of storage is very expensive.

Figure 1A:
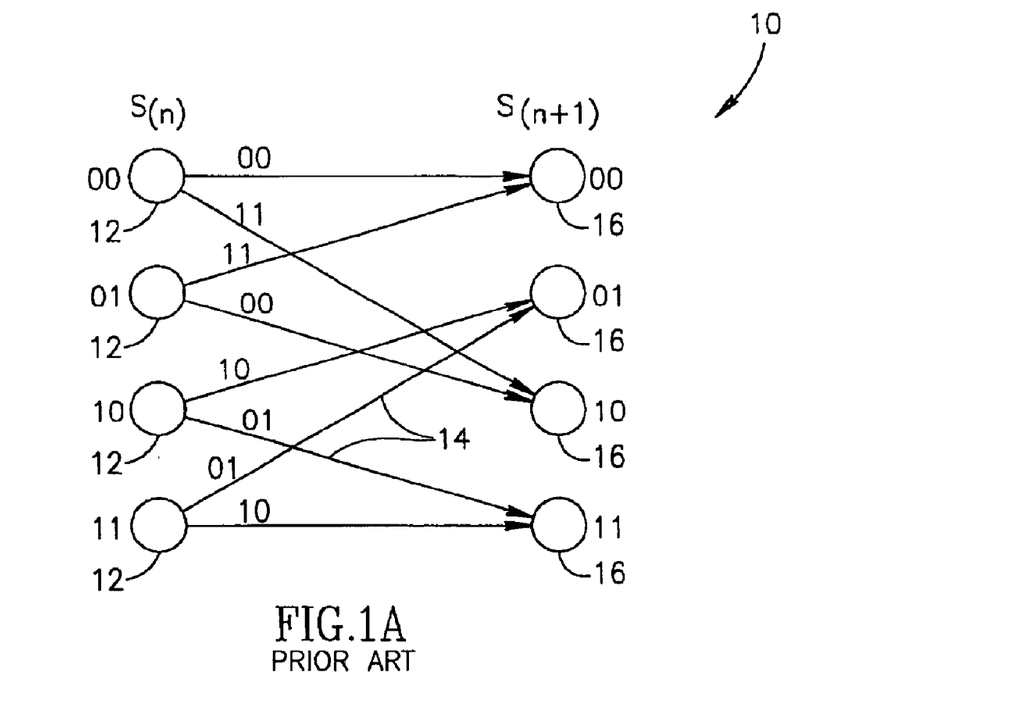
FIG. 1A is an exemplary trellis map of the convolutional code 7.5 which is known in the art.

FIG. 1A is an exemplary trellis map 10 of the convolutional code 7.5 which is known in the art. The encoder of the 7.5 code may be in any of four states s(n) 12 identified by a combination of two bits. From each of the states s(n), the encoder can move to one of two other states s(n+1) based on an input bit d(n), as indicated by branches 14. In moving from state s(n) to state s(n+1) 16, the encoder provides a symbol group formed of a pair of bits $c_0(n)$ and $c_1(n)$. The symbol group $c_0(n)$ and $c_1(n)$ is transmitted to a receiver which uses a decoder to determine the original bits d(n). The decoder assigns each received symbol group with a vector of branch metric (BM) values $\delta_n(c_0,c_1)$ which designate the conditional probability that the received symbol group originates from the transmitted symbol group designating $c_0$ and $c_1$. In addition, the decoder calculates forward ($\alpha_n$) and backward ($\beta_n$) state metric vectors which have elements for each of the states s(n) which designate the conditional probability that the decoder was in the state s(n) at time n. Generally, forward vectors $\alpha_n$ are recursively dependent on preceding vectors ($\alpha_{n+1}=f(\alpha_n, \delta_n)$), and backward vectors $\beta_n$ are recursively dependent on following vectors ($\beta_n=f(\beta_{n+1}, \delta_n)$).

Figure 1B:
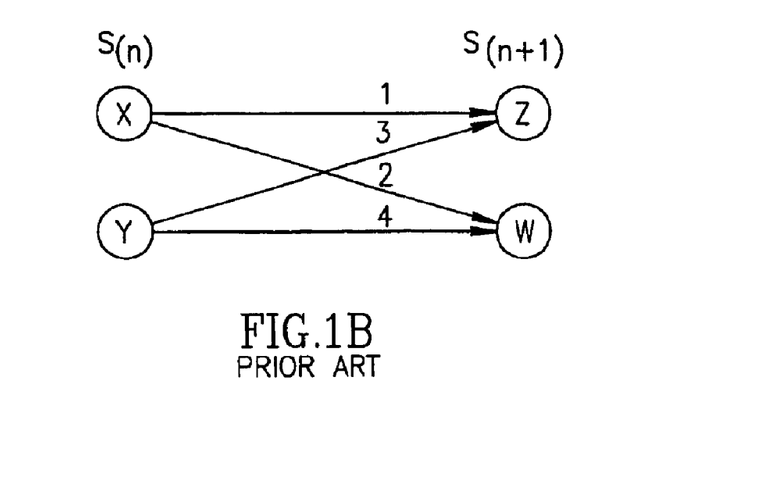
FIG. 1B is a butterfly trellis diagram for convolutional codes which is known in the art.

As can be seen in FIG. 1A, Each pair of states s(n) is connected to a pair of states s(n+1) although not necessarily the same states. The pairs of states with the connecting branches form a butterfly trellis which is depicted in FIG. 1B which is a butterfly trellis diagram for convolutional codes. This feature of pairs of states is generally true in trellises of convolutional codes. In FIG. 1A states 00 and 01 (which are equivalent to states X and Y in FIG. 1B) at time n are connected to states 00 and 10 (which are equivalent to states Z and W in FIG. 1B) at time n+1. Similarly, states 10 and 11 at time n (which are equivalent to states X and Y in FIG. 1B) are connected to states 01 and 11 at time n+1 (equivalent to states Z and W in FIG. 1B).

SUMMARY OF THE INVENTION

An aspect of some preferred embodiments of the invention relates to reducing the amount of memory required for decoding convolutional codes.

An aspect of some preferred embodiments of the present invention relates to a method of providing pairs of forward and backward vectors concurrently to an LLR unit for A-Posteriori probability estimation of a decoded block. During a first stage, before the beginning of the operation of the LLR unit, substantially all of the backward vectors are calculated but only one or more reference vectors, from which the rest of the vectors may be easily re-calculated, are stored. During a second stage, the backward vectors which were not stored are calculated from the stored reference vectors and are supplied to the LLR unit along with the forward vectors.

In a preferred embodiment of the present invention, during the first stage, reference vectors are stored at predetermined intervals. In the second stage the reference vectors are retrieved in course from the storage and are used to re-calculate a group of non-stored vectors between a current and a previous reference vector. A short term storage area is used to store the re-calculated vectors. Each group of non-stored vectors are preferably stored in place of the previously re-calculated vectors, as the previously re-calculated vectors were used already and are not needed any more.

An aspect of some preferred embodiments of the present invention relates to using a reverse function in recalculating at least some of the vectors. In some preferred embodiments of the invention in which the backward vectors are calculated in the first stage using a reversible function, the backward vectors are calculated in the second stage using the reverse function of the function of the first stage. Thus, both the backward and forward vectors are calculated in the same direction of progression over the block during the second stage. In a preferred embodiment the vectors calculated in the first stage are not stored. Alternatively, a plurality of backward vectors from the first stage are stored, in order to limit possible round off errors due to the use of the reverse function and/or when singular functions are encountered. Further alternatively or additionally, the reverse function is used to re-calculate only some of the non-stored vectors and the rest of the recalculated vectors are calculated using the non-reversed function.

Therefore there is provided in accordance with a preferred embodiment of the present invention, a method of calculating recursive state metric vectors of a block of symbols, the state metric vectors being supplied to an output calculating unit, including pre-calculating the state metric vectors from a first side of the block, and calculating for a second time at least some of the state metric vectors from the first side of the block.

Preferably, pre-calculating the state metric vectors includes pre-calculating the state metric vectors before supplying substantially any of the vectors to the output calculating unit.

Preferably, the method includes storing fewer than all the pre-calculated vectors.

Preferably, calculating for a second time at least some of the state metric vectors includes calculating those vectors which were not stored.

Preferably, storing fewer than all the pre-calculated vectors includes storing a number of vectors which is about the square root of the number of pre-calculated vectors. Preferably, storing fewer than all the pre-calculated vectors includes storing vectors selected responsive to the locations of singular functions used in the pre-calculating of the vectors. Alternatively or additionally, storing fewer than all the pre-calculated vectors includes storing vectors selected in predetermined intervals. Preferably, storing vectors selected in predetermined intervals includes storing vectors with equal intervals between them. Alternatively, storing vectors selected in predetermined intervals includes storing vectors with intervals of decreasing size between them.

Preferably, calculating for a second time the at least some of the state metric vectors includes calculating the vectors based on the stored vectors.

Preferably, calculating for a second time the at least some of the state metric vectors includes calculating at least some of the at least some of the vectors using a reverse function of a function used in the pre-calculating. Preferably, substantially none of the pre-calculated vectors are stored during the pre-calculation. Alternatively, substantially only pre-calculated vectors from which a next pre-calculated vector is calculated using a non-reversible function, are stored during the pre-calculation.

Preferably, calculating for the second time includes calculating at least some of the vectors using the function which was used in the pre-calculation. Alternatively or additionally, the pre-calculating is performed using a function which is an approximation of an original function and calculating for a second time the at least some of the state metric vectors includes calculating at least some of the at least some of the vectors using a reverse function of the original function. Further alternatively or additionally, the pre-calculating is performed using a function which is an approximation of an original function when the original function is non-reversible.

Preferably, pre-calculating the state metric vectors from a first side of the block includes calculating forward state metric vectors. Alternatively, pre-calculating the state metric vectors from a first side of the block includes calculating backward state metric vectors. Preferably, the method includes calculating state metric vectors from a second side of the block after the pre-calculating.

Preferably, pre-calculating the state metric vectors includes pre-calculating a number of vectors substantially of the size of an encoding block. Alternatively or additionally, pre-calculating the state metric vectors includes pre-calculating a number of vectors substantially smaller than the size of an encoding block.

There is further provided in accordance with a preferred embodiment of the present invention, a method of calculating recursive state metric vectors from opposite sides of a block of symbols, the state metric vectors being supplied to an output calculating unit, including pre-calculating a plurality of state metric vectors from a first side of the block, storing fewer than all the pre-calculated state metric vectors, and calculating state metric vectors from a second side of the block after pre-calculating the plurality of state metric vectors from the first side of the block. Preferably, the method includes calculating at least one of the state metric vectors from the first side of the block for a second time after calculating at least one of the state metric vectors from the second side of the block. Preferably, calculating at least one of the state metric vectors from the first side of the block includes calculating the state metric vectors from the stored vectors. Preferably, storing fewer than all the pre-calculated vectors includes storing vectors calculated in predetermined intervals. Preferably, calculating the at least one of the state metric vectors includes calculating based on the closest stored vector.

Preferably, the method includes presenting an output calculating unit with pairs of corresponding state metric vectors from opposite sides of the block. Preferably, the block of symbols is divided into a plurality of segments defined by the stored vectors and the method includes calculating for substantially all the segments at least one of the vectors for a second time based on the respective stored vectors of the segment. Preferably, calculating for substantially all the segments includes calculating for all the segments except the first segment. Preferably, the method includes storing the at least one of the vectors which was calculated for the second time. Preferably, calculating the at least one of the vectors for the second time includes calculating substantially all the non-stored vectors of the segment. Preferably, the method includes storing substantially all the vectors of the segment which were calculated for the second time. Preferably, the method includes calculating at least one of the vectors from the first side of the block for at least a third time.

There is further provided in accordance with a preferred embodiment of the present invention, a method of calculating recursive state metric vectors of a block of symbols, the state metric vectors being supplied to an output calculating unit, including calculating a plurality of state metric vectors representing a first side of the block using a first function, and calculating a plurality of state metric vectors representing the first side of the block using a second function different from the first function.

Preferably, the first function is identical to a third function when the third function is reversible and is received by adding a small value to the third function when the third function is non-reversible. Preferably, the second function is substantially a reverse of the first function.

Alternatively, the first function includes an approximation of a third function and the second function includes a substantial reverse of the third function.

Preferably, the first function includes a log MAP function.

Preferably, calculating the plurality of vectors using the first function includes calculating substantially all the vectors representing the first side of the block.

There is further provided in accordance with a preferred embodiment of the present invention, a method of calculating recursive state metric vectors of a block of symbols, the state metric vectors being supplied to an output calculating unit, including calculating a plurality of state metric vectors representing a first side of the block recursively based on immediately preceding vectors in the block, and calculating a plurality of state metric vectors representing a second side of the block based on immediately preceding vectors in the block.

Preferably, calculating the plurality of vectors representing the first and second sides of the block includes calculating pairs of vectors representing first and second sides of the block, substantially concurrently.

There is further provided in accordance with a preferred embodiment of the present invention, a state metric calculation unit, including circuitry for recursively calculating state metric vectors from a first side of a block including a predetermined number of symbol groups, and a memory for storing state metric vectors which has a maximal storage space for state metric vectors substantially smaller than that required to store the predetermined number of state metric vectors.

Preferably, the maximal storage space of the memory has room for storing less than fifty percent of the predetermined number of state metric vectors. Further preferably, the maximal storage space of the memory has room for storing less than twenty percent of the predetermined number of state metric vectors.

Preferably, the circuitry implements a plurality of different functions for calculating the state metric vectors. Preferably, the circuitry implements a pair of functions for calculating the state metric vectors which pair include mutual reverse functions.

Preferably, the memory includes a long term storage area for storing pre-calculated state metric reference vectors in predetermined intervals and a short term storage area for storing state metric vectors between two reference vectors. Preferably, the long term storage area serves for storing also state metric vectors from between two reference vectors.

BRIEF DESCRIPTION OF FIGURES

The invention will be more clearly understood by reference to the following description of preferred embodiments thereof in conjunction with the figures, in which same number designations are maintained throughout the figures for each element and in which.

DETAILED DESCRIPTION OF THE PREFERRED EMBODIMENTS

Figure 2:
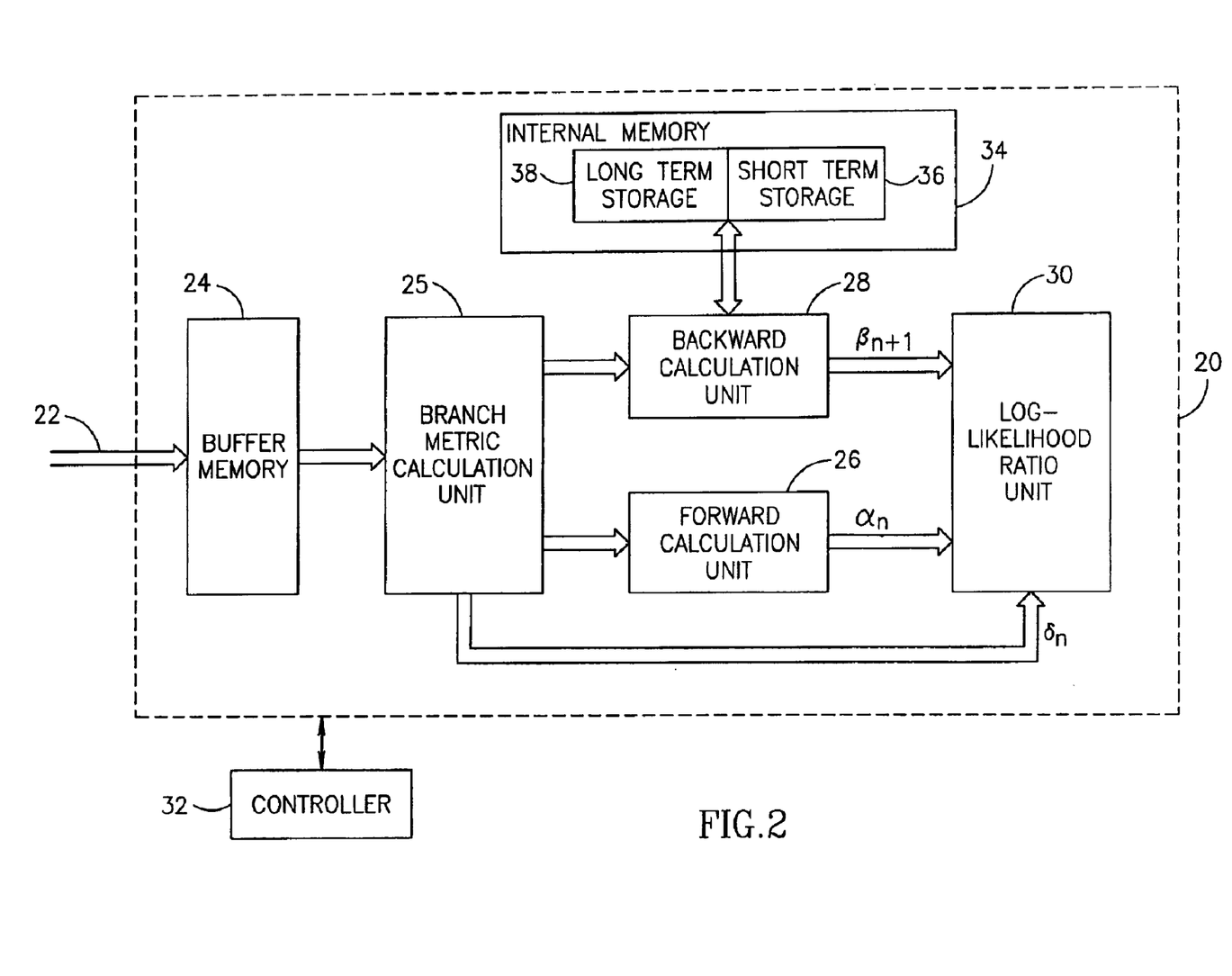
FIG. 2 is a schematic illustration of a decoder, in accordance with a preferred embodiment of the present invention.

FIG. 2 is a schematic illustration of a decoder 20, in accordance with a preferred embodiment of the present invention. Decoder 20 preferably receives soft data symbols along an input channel 22. A buffer memory 24 accumulates a sufficient number of symbols in order to decode a sub-block. The received symbols are grouped into groups of one or more symbols according to the encoding scheme of the received data symbols. For each symbol group, an LLR unit 30, calculates an output value corresponding to the location of the symbol group in the sub-block. The calculation is preferably based on the values of substantially all the symbol groups in the sub-block, as is known in the art, and described, for example, in the above mentioned publication of Steven S. Pietrobon. In the following description the accumulated sub-block is assumed to comprise L1 groups of symbols ($R_1, \ldots, R_{L1}$). In addition, buffer memory 24 preferably accumulates L2 additional groups of symbols ($R_{L1+1}, \ldots, R_{L1+L2}$) the purpose of which is described hereinbelow.

As is known in the art, a branch metric (BM) calculation unit 25 calculates branch metrics (BMs) which represent the groups of symbols from buffer memory 24 in the calculations. Alternatively, buffer memory 24 accumulates the BMs which were calculated by BM calculation unit 25.

A forward calculation unit 26 and a backward calculation unit 28 calculate forward and backward state metric (SM) vectors, respectively, based on the accumulated symbols, as is known in the art.

LLR unit 30 uses the SM vectors from forward and backward calculation units 26 and 28, together with the BMs from BM calculation unit 25, to provide the output values for each of the groups of symbols in the sub-block, using any method known in the art. The output provided by LLR unit 30 for each group of symbols, may comprise hard-data and/or soft-data values, may comprise a decoded value or may comprise an intermediate value used in additional decoding steps.

In order to calculate its output for each symbol group, LLR unit 30 receives the respective BM ($\delta_n$) of the bit from buffer memory 24 and the SM vectors ($\alpha_n$, $\beta_{n+1}$) which correspond to the location of the symbol group within the sub-block, from both forward calculation unit 26 ($\alpha_n$) and backward calculation unit 28 ($\beta_{n+1}$). The forward SM vectors ($\alpha_n$) are calculated by forward calculation unit 26 recursively from the beginning of the sub-block, based on a starting SM vector ($\alpha_1$) and the BMs ($\delta_1, \ldots, \delta_{n-1}$). The starting SM vector ($\alpha_1$) is preferably determined either based on the SM vector from a previous sub-block or based on a predetermined value from which the decoding begins, e.g., a vector of zeros. Likewise, the backward SM vectors ($\beta_n$) are calculated by backward calculation unit 28 recursively from the end of the sub-block based on a last backward SM vector ($\beta_{L1+1}$) of the sub-block and the BMs ($\delta_{n+1}, \ldots, \delta_{L1}$). The ending backward SM vector ($\beta_{L1+1}$) is of a predetermined value or is calculated from the additional groups of symbols ($R_{L1+1}, \ldots, R_{L1+L2}$) using any method known in the art, for example, that described in the above mentioned PCT publication WO98/20617. The number of additional groups of symbols L2 depends, as described in the above publication, on the size of the encoder and on the desired accuracy of the calculations.

Backward calculation unit 28 preferably calculates the SM vectors in two stages. In a first preparation stage, performed before the beginning of the operation of LLR unit 30, backward calculation unit 28 calculates the backward SM vectors recursively and stores a plurality of them as reference vectors to be used in the second stage. The reference vectors are preferably stored in a long term storage 38 of an internal memory 34. In the second stage, a decoding stage, backward calculation unit 28 preferably operates in parallel with LLR unit 30 and forward calculation unit 26 and calculates the backward SM vector ($\beta_n$) presently needed by the LLR unit, based on the closest stored reference vector of a higher index (the backward vectors ($\beta_n$) are calculated from the highest index to the lowest index recursively, using methods known in the art). In a preferred embodiment of the invention, internal memory 34 includes a short term storage area 36 in which the backward SM vectors between two reference vectors are stored between their calculation and use during the decoding stage. This is a recalculation of values previously calculated and thrown away.

A controller 32 controls the timing and operation of the units of decoder 20, in accordance with the following description.

Figure 3:
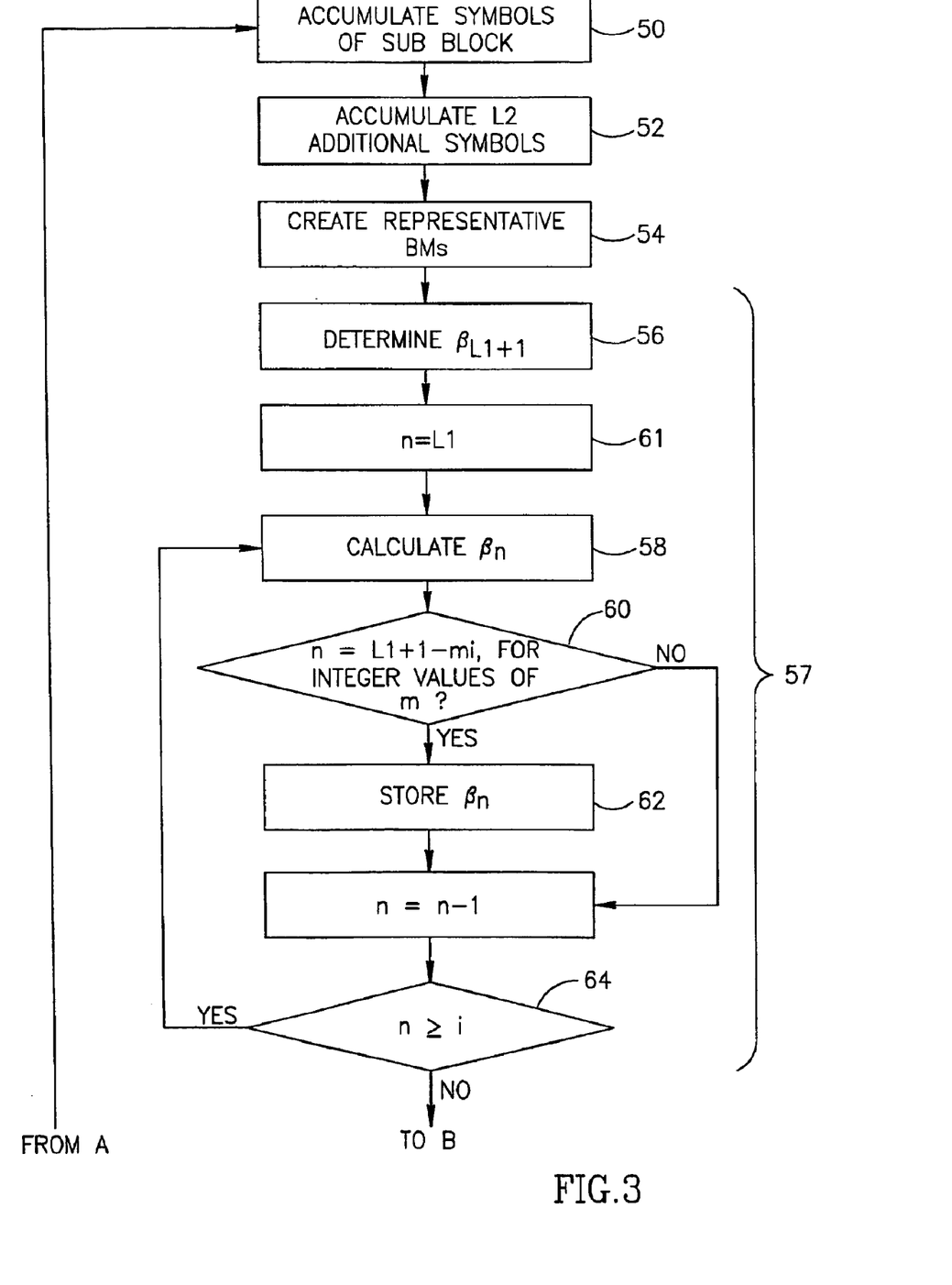
FIGS. 3A and 3B are a flow chart of the actions performed in decoding received data symbols, in accordance with a preferred embodiment of the present invention.

FIG. 3 is a flow chart of the actions performed in decoding received data symbols by decoder 20, in accordance with a preferred embodiment of the present invention. Buffer memory 24 accumulates (block 50) symbols belonging to a sub-block of L1 symbol groups. In addition, buffer memory 24 preferably accumulates (bock 52) L2 additional symbol groups in order to calculate the last backward SM vector ($\beta_{L1+1}$) of the sub-block. BM calculation unit 25 preferably creates (block 54) respective representative BMs from the accumulated symbols, as is known in the art.

Figures 4, 5:
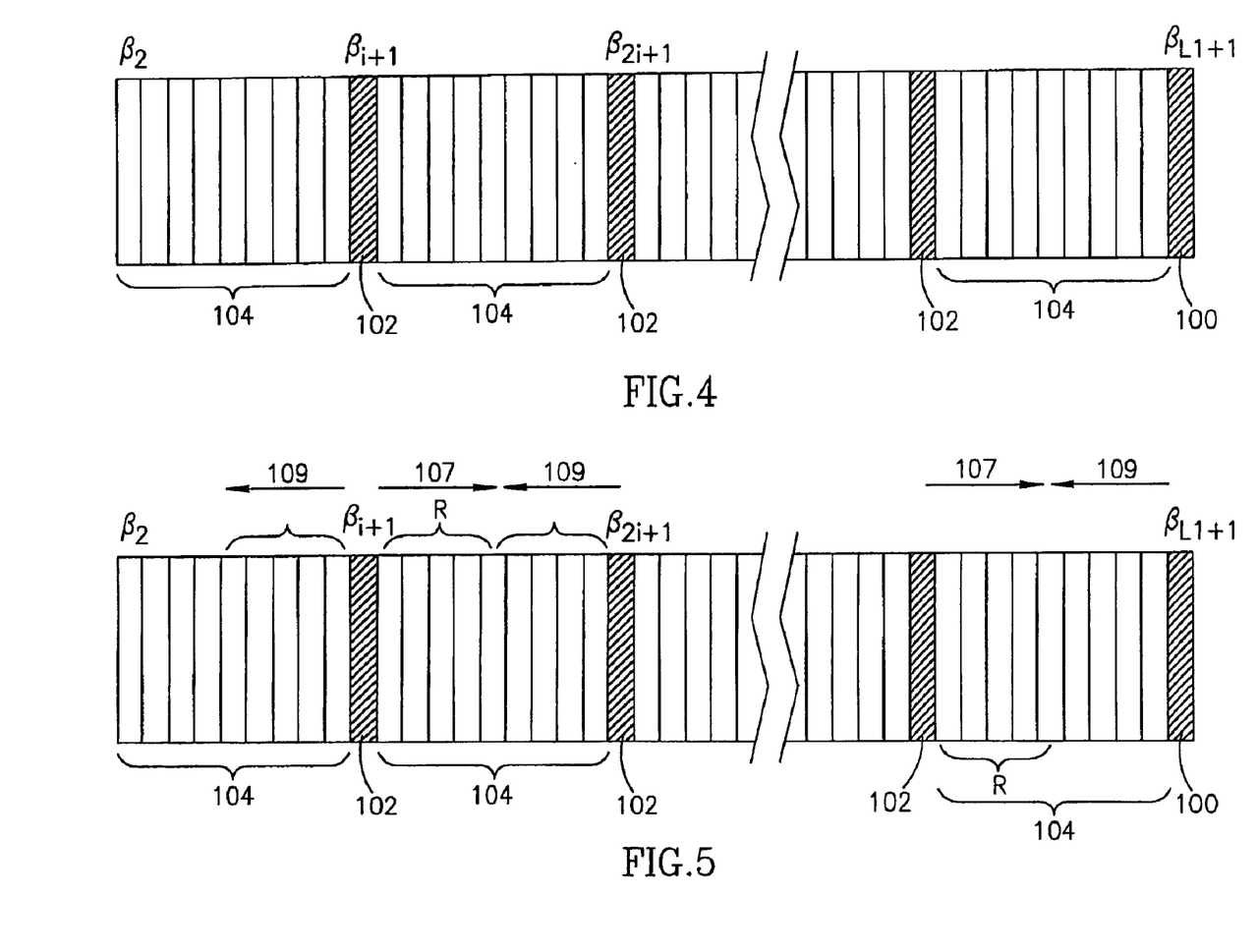
FIG. 4 is a schematic illustration of SM vectors of a decoded sub-block, in accordance with a preferred embodiment of the present invention.
FIG. 5 is a schematic illustration of SM vectors of a decoded sub-block, in accordance with another preferred embodiment of the present invention.

Reference is also made to FIG. 4 which is a schematic illustration of the backward SM vectors ($\beta_n$) of the decoded sub-block, in accordance with a preferred embodiment of the present invention. In the preparation stage, backward calculation unit 28 calculates (block 57) backward SM vectors ($\beta_n$), using the representative BMs of the accumulated symbols of the sub block. Backward calculation unit 28 first determines (block 56) the last backward SM vector ($\beta_{L1+1}$) 100 of the sub block. Preferably, backward calculation unit 28 chooses an arbitrary SM vector as the value of $\beta_{L1+L2}$, for example a zero vector. Using the arbitrary vector and the L2 additional symbol groups, backward calculation unit 28 calculates recursively the SM vectors $\beta_{L2+L1}$ to $\beta_{L1+1}$. The calculation is performed as is known in the art, for example as described in any of the above referenced application. With the calculation of each of the vectors, the previous vector is discarded as these vectors do not carry reliable data and are not needed for further calculations. Vector $\beta_{L1+1}$ on the other hand is considered reliable as it is the result of L2 consecutive symbol group calculations and is stored in long term storage 38, for later use.

After backward SM vector $\beta_{L1+1}$ is calculated, backward calculation unit 28 continues to recursively calculate (block 58) the SM vectors $\beta_{L1}, \ldots, \beta_{i+1}$ and periodically stores (block 62) some of the vectors 102 in long term storage 38, for later use. The reference vectors 102 to be stored are chosen according to a predetermined scheme. In some preferred embodiments of the invention, the reference vectors are distributed throughout the sub block in equal intervals of SM vectors 104. In a preferred embodiment, illustrated by blocks 60, 61 and 64, backward calculation unit 28 stores every i'th backward SM vector, i.e., $\beta_{L1+1-mi}$ (m=0 ... M=L1/i) where i is close to the square root of L1, e.g., between 6 and 10. In the following description it is assumed for simplicity that L1 is divisible by i, and the stored backward reference vectors 102 are $\beta_{i+1}, \beta_{2i+1}, \ldots, \beta_{L1+1}$.

After the last backward vector 102 ($\beta_{i+1}$) to be stored in long term storage 38 is calculated, the decoding stage is performed. The decoding stage is formed of a plurality of steps (M steps). In each step LLR unit 30 provides output for i groups of symbols. Each of the steps, is formed of two phases. In a first phase (block 66), backward calculation unit 28 calculates the backward SM vectors ($\beta_{mi}, \ldots, \beta_{(m-1)i+1}$) needed for that step, and stores them in short term storage 36. Backward calculation unit 28 retrieves a reference vector ($\beta_{mi}$) 102 from long term storage 38, and calculates therefrom, recursively, SM vectors ($\beta_{mi-1}, \ldots, \beta_{(m-1)i+1}$). In a preferred embodiment, also the retrieved reference vector ($\beta_{mi}$) is stored in short term storage 36.

In the second phase (block 71) of each step, forward calculation unit 26 calculates (block 68) the forward SM vectors ($\alpha_n$) of that step, and forward and backward calculation units 26 and 28 provide (block 72) concurrently pairs of forward and backward SM vectors ($\alpha_n, \beta_{n+1}$) to LLR unit 30. Preferably, backward calculation unit 28 provides the SM vectors by retrieving them from short term storage 36. LLR unit 30 immediately calculates (block 74) its output responsive to the provided vectors and the relevant BM.

Decoder 20 then proceeds in decoding a following sub-block (returning to block 50), as is known in the art. It is noted that some of the operations in handling the following sub-block may be performed concurrently with the decoding stage 70 of the current sub-block.

The number of reference vectors stored in long term storage 38 is chosen in a manner which minimizes the required size of internal memory 34. The minimization is performed in a manner which does not increase the required computational resources of backward calculation unit 28 above a desired threshold. In a preferred embodiment of the invention, the number of reference vectors i stored in long term storage 38, is approximately equal to the square root of L1 (the size of the decoded sub-block), as using the square root minimizes the size of memory 34. Thus, the long term storage 38 is of a size which accommodates i vectors and the size of short term storage 36 is, as well, one which accommodates i vectors. Thus, the total size of memory 34 is one which accommodates 2i SM vectors.

Alternatively, long term storage 38 is larger, in order to reduce the amount of calculations required during the first phase (block 66) of the steps of the decoding stage. Further alternatively, the number of vectors 104 between each pair of reference vectors 102 is chosen in a manner which simplifies the implementation of backward calculation unit 28. In a preferred embodiment of the invention, the distance between consecutive reference vectors 102 is equal to $2^n$, n being an integer. Thus, the hardware implementation of backward calculation unit 28 is simplified.

Alternatively to having the same number of SM vectors 104 between the stored reference vectors 102, the number of vectors 104 between the stored reference vectors 102 differ throughout the sub-block. In a preferred embodiment of the present invention, the number of vectors 104 between the stored reference vectors 102 increases with the indexes n of the symbol groups of the sub-block, i.e., the number of vectors 104 decreases with the progression of the backward calculation from the end of the sub-block to the beginning. During the first step of the decoding stage, long term storage 38 is full with SM vectors required at later steps of the decoding stage and therefore short term storage 36 must be used to store all the SM vectors calculated during the first phase (block 66) of the first step of the decoding stage. At later steps, however, the number of spaces in long term storage 38 which are used decreases and the vacant spaces are used for storing some of the vectors calculated during the first phase (block 66) of later steps of the decoding stage. In this embodiment, the border between long term storage 38 and short term storage 36 moves with the steps of the decoding stage.

For example, in a preferred embodiment of the invention, the size L1 of the sub-block is 100, and vectors $\beta_{10}, \beta_{20}, \beta_{31}, \beta_{43}, \beta_{56}, \beta_{70}, \beta_{85}$ and $\beta_{101}$ are stored in long term storage 38 during the preparation stage (block 57). In the first phase (block 66) of the first step of the decoding stage, backward calculation unit 28 calculates eight vectors, i.e., $\beta_2, \ldots, \beta_9$, which are stored in short term storage 36. In the first phase of the second step of the decoding stage, backward calculation unit 28 calculates nine vectors, i.e., $\beta_{11}, \ldots, \beta_{18}, \beta_{19}$. Eight of the vectors, e.g. $\beta_{11}, \ldots, \beta_{18}$, are stored in short term storage 36, and the ninth vector, e.g., $\beta_{19}$, is stored in long term storage 38 in place of vector $\beta_{10}$ which is not needed anymore. In each following step, the number of vectors calculated in the first phase (block 66) increases by one, and the additional vector is stored in long term storage 38 in the places of the vectors which are not needed anymore. Thus, the number of spaces required for storing vectors in memory 34 is equal to 17, relative to 19 required spaces for evenly spaced reference vectors.

For some decoding methods, such as for the log-map method, a function f used in calculating backward SM vector ($\beta_n$) from ($\beta_{n+1}$) is a reversible function, such that a reverse function $f^{-1}$ may be used to calculate ($\beta_{n+1}$) from ($\beta_n$). In some preferred embodiments of the present invention, the reverse function $f^{-1}$ is used to calculate the backward SM vectors ($\beta_n$) from the reference vectors during the decoding stage.

In a preferred embodiment of the present invention, the first backward SM vector of the sub-block ($\beta_2$) is calculated during the preparation stage (block 57). During the decoding stage, backward calculation unit 28 calculates vector ($\beta_{n+1}$) from ($\beta_n$) using $f^{-1}$, concurrently with the calculation of ($\alpha_n$) from ($\alpha_{n-1}$) by forward calculation unit 26. In this embodiment memory 34 comprises only long term storage 38, and the first phase (block 66) of the decoding stage, which is time consuming, is eliminated.

In a preferred embodiment of the present invention, backward calculation unit 28 does not include an internal memory 34'. Rather, during the preparation stage (block 57) backward calculation unit 28 calculates the first backward SM vector ($\beta_2$) and uses the reverse function $f^{-1}$ to calculate all the backward SM vectors from $\beta_2$, during the decoding stage.

It is noted, however, that in some cases $f^{-1}$ introduces inaccuracies in the calculations due to round off problems of reverse functions. Therefore, as described above, in some preferred embodiments, reference vectors are stored in long term storage 38 during the preparation stage (block 57), and the reverse function $f^{-1}$ is used only between the reference vectors. The distance between the reference vectors is set based on a maximal number of allowed consecutive reverse-function iterations R. The maximal number of reverse iterations R is determined so that the round off error due to the use of the reverse function $f^{-1}$ is limited below a desired level.

FIG. 5 is a schematic illustration of the SM vectors ($\beta_n$) of the decoded sub-block, in accordance with a preferred embodiment of the present invention. In some preferred embodiments of the present invention, only some of the backward SM vectors ($\beta_n$) are calculated using the reverse function $f^{-1}$ during the decoding stage. The rest of the backward SM vectors ($\beta_n$) are calculated during the first phase (block 66) of the decoding stage using the forward function f, as described above. For example, for each group of SM vectors 104, the first R vectors 107, which have lower indexes are calculated using $f^{-1}$. The rest of the vectors, i.e., vectors 109, are calculated from the nearest reference vector 102 using function f, as described above. Stated otherwise, in each step of the decoding stage backward calculation unit 28 retrieves a reference vector 102 from long term storage 38. Using function f, vectors 109 are calculated and stored in short term storage 36, during the first phase (block 66). Thereafter, the same reference vector 102 is used with the reverse function $f^{-1}$ to calculate SM vectors 107.

In a preferred embodiment, the distance between the reference vectors is determined using any of the considerations described above and based on the maximal number of allowed consecutive reverse iterations R. Designating the number of vectors which may be stored in short term storage 36 by S1, the number of vectors between two neighboring reference vectors 102 is S1+R. The number of reference vectors is S2=L1/(S1+R) and it is desired to minimize the space required in memory 34, i.e., S1+S2.

In some preferred embodiments of the present invention, function f is a non-reversible function $f_1$ which is an approximation of a reversible function $f_2$, e.g., due to round off or when using the log-max method which is an approximation of the log-map method. In one of these embodiments, some or all of the calculations which are performed using f, are performed with $f = f_1$, the non-reversible function. Calculations performed with the reverse function $f^{-1}$ and possibly some of the calculations performed using f, are performed with $f_2$ ($f_2^{-1}$).

Following is a showing of the reverse $f^{-1}$ for exemplary functions f. Generating the reverse function equations for any other code will be obvious to those skilled in the art.

In the 7.5 code described hereinabove with reference to FIG. 1A, using the linear MAP method, function f is defined by the equation set:

$$\begin{bmatrix} \beta_n^{00} \\ \beta_n^{01} \end{bmatrix} = \begin{bmatrix} \delta_n^{00} & \delta_n^{11} \\ \delta_n^{11} & \delta_n^{00} \end{bmatrix} \begin{bmatrix} \beta_{n+1}^{00} \\ \beta_{n+1}^{10} \end{bmatrix} \text{ and } \begin{bmatrix} \beta_n^{10} \\ \beta_n^{11} \end{bmatrix} = \begin{bmatrix} \delta_n^{10} & \delta_n^{01} \\ \delta_n^{01} & \delta_n^{10} \end{bmatrix} \begin{bmatrix} \beta_{n+1}^{01} \\ \beta_{n+1}^{11} \end{bmatrix} \quad (1)$$

The reverse function $f^{-1}$ is therefore defined by the following equations;

$$\begin{bmatrix} \beta_{n+1}^{00} \\ \beta_{n+1}^{10} \end{bmatrix} = \begin{bmatrix} \delta_n^{00} & \delta_n^{11} \\ \delta_n^{11} & \delta_n^{00} \end{bmatrix}^{-1} \begin{bmatrix} \beta_n^{00} \\ \beta_n^{01} \end{bmatrix} \text{ and} \quad (2)$$

$$\begin{bmatrix} \beta_{n+1}^{01} \\ \beta_{n+1}^{11} \end{bmatrix} = \begin{bmatrix} \delta_n^{10} & \delta_n^{01} \\ \delta_n^{01} & \delta_n^{10} \end{bmatrix}^{-1} \begin{bmatrix} \beta_n^{10} \\ \beta_n^{11} \end{bmatrix}$$

In some preferred embodiments of the present invention, when it is determined during calculation of a vector $\beta_n$ from $\beta_{n+1}$ in preparation stage (block 57) that the branch metrics $\delta_n$ form a non-reversible (singular) function, one or more of the branch metrics $\delta_n$ are slightly changed in order to remove the singularity. For example, referring to equations (1), when for a specific n, the matrix in either of equations (1) is singular, i.e., $\delta_n^{00} = \delta_n^{11}$ or $\delta_n^{01} = \delta_n^{10}$, a value $I_\epsilon$ for a small $\epsilon$ is added to the matrix. That is, a value $\epsilon$ is added to $\delta_n^{00}$ or $\delta_n^{10}$ as required. Alternatively, a value $\epsilon$ is added to $\delta_n^{01}$ or $\delta_n^{11}$ as required in order to remove the singularity.

Alternatively or additionally, when the function for calculating vector $\beta_n$ from vector $\beta_{n+1}$ is singular, backward calculation unit 28 stores $\beta_{n+1}$ such that it is not necessary to use the reverse of the singular matrix. Memory 34 comprises a special storage area (not shown) for vectors stored due to singularities. Alternatively or additionally, at least some of the reference vectors 102 are chosen based on the singularities. In a preferred embodiment of the present invention, backward calculation unit 28 stores reference vectors at equal intervals unless a singular equation is encountered in which case the vector on which the singular function is applied is stored and the equal vector intervals are counted from that vector. In another preferred embodiment of the invention, the number of reference vectors 102 stored during the preparation stage (block 57) is constant and the intervals between reference vectors 102 when singularities are not encountered are adjusted according to the number of singularities encountered during the preparation stage. For example, preparation stage (block 57) may begin with storing each tenth vector. If a large number of singularities are encountered the interval between reference vectors is enlarged and, for example, every 15th vector is stored. If, however, less than an average number of singularities are encountered, the interval between stored vectors may be shortened.

Alternatively to storing entire vectors $\beta_{n+1}$ to which singular functions are applied, a part of these vectors $\beta_{n+1}$, including one or more elements, is stored. The one or more stored elements allow calculation of the rest of the elements $\beta_{n+1}$ from $\beta_n$ despite the singularity of the function.

Alternatively or additionally to storing vectors to which singular functions are applied, vectors which cannot be calculated using the reverse function $f^{-1}$ due to the singularity, are calculated during the first phase (block 66) of the decoding stage 70 using function f. For each interval between reference vectors 102, the number of vectors 109 (FIG. 5) calculated using function f, and the number of vectors 107 calculated using function $f^{-1}$, are dynamically adjusted according to whether the interval includes singular functions and where the singular function appears within the interval.

For the log MAP method, $\beta_n$ and $\delta_n$ have values which are the logarithms of their values in the linear case. Using the definitions in FIG. 1B, the equations defining f for a pair of states x and y, are:

$$\beta_n^x = \log(e^{\delta_n^1 + \beta_{n+1}^z} + e^{\delta_n^2 + \beta_{n+1}^w}) \text{ and } \beta_n^y = \log(e^{\delta_n^3 + \beta_{n+1}^z} + e^{\delta_n^4 + \beta_{n+1}^w}).$$

The reverse function $f^{-1}$ is defined by the equations:

$$\beta^x_{n+1} = \log\left(\frac{e^{(\delta^4_n+\beta^x_n)} - e^{(\delta^2_n+\beta^y_n)}}{e^{(\delta^1_n+\delta^4_n)} - e^{(\delta^2_n+\delta^3_n)}}\right) \text{ and} \quad (3)$$

$$\beta^w_{n+1} = \log\left(\frac{e^{(\delta^1_n+\beta^y_n)} - e^{(\delta^3_n+\beta^x_n)}}{e^{(\delta^1_n+\delta^4_n)} - e^{(\delta^2_n+\delta^3_n)}}\right) \quad (4)$$

As LLR unit 30 is only interested in the relative values of the elements of backward vectors $\beta_n$, equations (3) and (4) are replaced by:

$$\beta^x_{n+1} = \log\left|e^{(\delta^4_n+\beta^x_n)} - e^{(\delta^2_n+\beta^y_n)}\right| + C \text{ and} \quad (3')$$

$$\beta^w_{n+1} = \log\left|e^{(\delta^1_n+\beta^y_n)} - e^{(\delta^3_n+\beta^x_n)}\right| + C \quad (4')$$

For the log MAP method, functions f and $f^{-1}$ are implemented partially or entirely using one or more look up tables (LUT). In a preferred embodiment of the invention, a LUT is used to approximate the function $\log(1+e^{|x|})$ and $\log(1-e^{|x|})$. Singularities are handled using any of the methods described above regarding the linear MAP method.

The number L1 of symbol groups in each sub-block used in decoding is chosen as a compromise between the required amount of memory space and the decoding speed and accuracy. A conventional number of symbol groups L1 used in the prior art is approximately 100. Although substantially any size L1 of the sub-block may be used, in some preferred embodiments of the invention, the size L1 of the sub-block is substantially larger than that conventionally used in the prior art. Using the methods of the present invention, the required size of memory 34 for a given size L1 of the sub-block is significantly reduced relative to the prior art. Therefore it is possible to increase the size L1 of the sub blocks, achieving faster and better decoding, without substantially increasing the required size of memory 34. In a preferred embodiment of the invention, the decoding is performed on entire blocks, thus eliminating the need to accumulate (block 52) the additional symbol groups and to calculate (block 56) $\beta_{L1+1}$. Thus, the additional time requited relative to the prior art for performing the first phase (block 66) of the decoding stage, is partially compensated for.

It is noted that the size L1 of the sub-blocks used in decoding is not necessarily constant and L1 may change during the decoding.

The implementation of the present invention does not depend on the number of bits included in the state metrics in the forward and backward vectors, and substantially any number of bits may be used according to considerations known in the art. It is noted, however, that in some preferred embodiments of the present invention, the reduction in storage space achieved by the invention is used to increase the number of bits included in each state metric and thus increase the accuracy of decoder 20.

Figure 6:
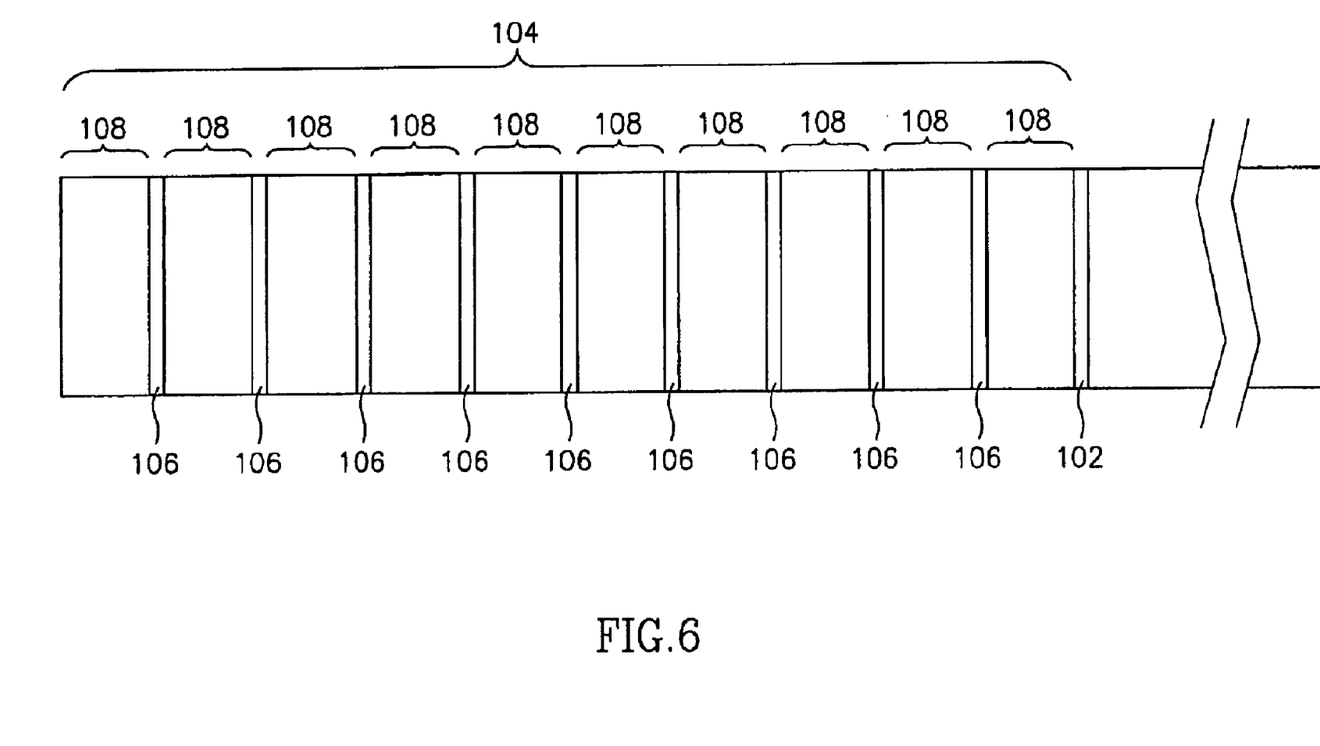
FIG. 6 is a schematic illustration of SM vectors of a large block, in accordance with a preferred embodiment of the present invention.

FIG. 6 is a schematic illustration of the backward reference vectors ($\beta_n$) of a large block, in accordance with a preferred embodiment of the present invention. In some preferred embodiments of the invention, the preparation phase (block 66) comprises a plurality of sub phases, in order to further conserve memory space. Instead of calculating and storing all the SM vectors 104 between the reference vectors in one shot, requiring short term storage 36 to be of the size required to store all of vectors 104, backward calculation unit 28 calculates and stores the vectors 104 in a plurality of sub phases. For example, if the large block comprises a thousand symbol groups and the number of vectors 104 between the reference vectors 102 is one hundred, during the first sub phase backward calculation unit 28 may store every tenth vector 106. In a second sub-phase of preparation phase (block 66), backward calculation unit 28 calculates and stores all the vectors 108 between vectors 106. Thus, for a large block of a thousand symbols, the required storage space in memory 34 comprises only room for about thirty vectors: ten vectors 104 in long term storage 38, and ten vectors 106 and ten vectors 108 in short term storage 36.

It is noted that it is not necessary to store entire SM vectors in memory 34. For example, in some embodiments the different states of the SM vectors are related in a manner which allows calculating the entire vector $\beta_n$ from half of vector $\beta_n$ and a complementary half of vector $\beta_{n+1}$. In such embodiments, it is possible to store in long term storage 38 complementary parts of consecutive vectors rather than entire vectors.

For example, using as an example, the convolutional code 7.5 described above with reference to FIG. 1A, rather than storing for each reference vector $\beta_n$ all the state metrics in the vector, backward calculation unit 28 stores the state metrics $\beta_n(01)$, $\beta_n(00)$, $\beta_{n+1}(01)$, and $\beta_{n+1}(11)$. As can be seen from equations (1), $\beta_n(10)$ and $\beta_n(11)$ can be calculated from $\beta_{n+1}(01)$, and $\beta_{+1}(11)$ and therefore storing the above state metrics is equivalent to storing vector $\beta_n$ (ignoring the additional calculations).

In some preferred embodiments of the present invention, instead of storing all the elements of the reference vectors, only those elements of the vectors which are considered significant are stored, for some or all of the reference vectors. Alternatively or additionally, only some of the elements of the SM vectors stored during the decoding stage (in short term storage 36), are stored. The non-significant elements are elements which have a state metric value much lower than other elements in the vector such that the chance of that element to be in a decoding trellis is very slight.

It is noted that although the above description refers to forward decoding which requires pre-calculation of the backward SM vectors, the principles of the present invention apply equivalently to backward decoding in which the forward SM vectors are pre-calculated. Furthermore, although decoder 20 was shown as including only a single backward calculation unit 28, more than one unit may be used in parallel in order to speed up the operation of the decoder. In a preferred embodiment of the invention, backward calculation unit 28 comprises two sub-units which operate in parallel during the decoding stage. While a first sub-unit performs the second phase (71) of a current step, a second sub-unit performs the first phase (block 66) of a next step. In this embodiment, memory 34 includes two short term storage spaces 36 which are used by the two sub-units interchangeably.

It is further noted that the principles of the present invention apply substantially to any decoding method which implements the Bahl algorithm, and/or approximations of the Bahl algorithm, including the linear MAP version, the log MAP version, and the approximated log-max version. The principles of the present invention may be used with any finite state system, such as communication systems, and signal identification systems(e.g., handwriting voice and image recognition). The communication systems may be used in decoding convolutional codes, trellis coded modulation (TCM) codes, BCH codes, or any other finite state codes. Alternatively or additionally, the principles of the present invention may be applied in performing channel equalization and/or in implementing an Inter symbol Interference (ISI) equalizer.

It will be appreciated that the above described methods may be varied in many ways, including, changing the order of steps, and the exact implementation used. It should also be appreciated that the above described description of methods and apparatus are to be interpreted as including apparatus for carrying out the methods and methods of using the apparatus.

The present invention has been described using non-limiting detailed descriptions of preferred embodiments thereof that are provided by way of example and are not intended to limit the scope of the invention. Variations of embodiments described will occur to persons of the art. Furthermore, the terms "comprise," "include," "have" and their conjugates, shall mean, when used in the claims, "including but not necessarily limited to." The scope of the invention is limited only by the following claims:

What is claimed is:

1. A method comprising:
    recursively calculating by a backward calculation unit state metric vectors from a block of symbols in a predetermined direction;
    storing at a first storage area reference vectors corresponding to a selected group of the calculated state metric vectors; and
    re-calculating in the predetermined direction starting from a stored reference vector of the stored reference vectors at least some of the state metric vectors and storing at a second storage area the at least some re-calculated state metric vectors.

2. A method according to claim 1, wherein re-calculating at least some of the state metric vectors comprises calculating state metric vectors which were not stored as reference vectors.

3. A method according to claim 1, wherein storing reference vectors at the first storage area comprises storing a number of reference vectors equal to about the square root of the number of the calculated state metric vectors.

4. A method according to claim 1, wherein storing reference vectors at the first storage area comprises storing vectors selected in response to locations of singular functions used in calculating the state metric vectors.

5. A method according to claim 1, wherein storing reference vectors at the first storage area comprises storing vectors selected in predetermined intervals.

6. A method according to claim 5, wherein storing vectors selected in predetermined intervals comprises storing reference vectors with equal intervals between them.

7. A method according to claim 5, wherein storing vectors selected in predetermined intervals comprises storing vectors with intervals of decreasing size between them.

8. A method according to claim 1, wherein re-calculating at least some of the state metric vectors comprises re-calculating at least some of the state metric vectors using a reverse function of a function used in recursively calculating the state metric vectors from the block of symbols.

9. A method according to claim 1, wherein re-calculating at least some of the state metric vectors comprises re-calculating at least some of the vectors using a function used in recursively calculating the state metric vectors from the block of symbols.

10. A method according to claim 1, wherein recursively calculating the state metric vectors comprises calculating the state metric vectors using a function which is an approximation of an original function; and wherein re-calculating at least some of the state metric vectors comprises re-calculating at least some of the state metric vectors using a reverse function of the original function.

11. A method according to claim 10, wherein recursively calculating the state metric vectors comprises calculating a number of vectors substantially equal to a size of an encoding block.

12. A method according to claim 10, wherein calculating the state metric vectors comprises calculating a number of vectors substantially smaller than a size of an encoding block.

13. A method according to claim 1, wherein recursively calculating the state metric vectors comprises calculating the state metric vectors using a function which is an approximation of an original function when the original function is non-reversible.

14. A method according to claim 13, wherein recursively calculating the state metric vectors from the block of symbols comprises forward calculating of the state metric vectors.

15. A method according to claim 13, wherein recursively calculating the state metric vectors from the block of symbols comprises backward calculating of state metric vectors.

16. A method comprising:
    using a reversible function to calculate a plurality of state metric vectors from a block of symbols in a first direction;
    storing reference vectors selected from the calculated state metric vectors; and
    using a reversed function of the reversible function to re-calculate the state metric vectors from the block of symbols in a second direction wherein, the re-calculation starts from a stored reference vector of the stored reference vectors to substantially re-generating at least part of the calculated state metric vectors.

17. A method according to claim 16, further comprising re-calculating a first state metric vector from the block of symbols in the first direction after re-calculating a second state metric vector from the block of symbols in the second direction.

18. A method according to claim 17, wherein re-calculating the first state metric vector comprises re-calculating the first state metric vector based on a closest stored reference vector.

19. A method according to claim 16, wherein storing the reference vectors comprises storing two or more reference vectors calculated in predetermined intervals.

20. A method according to claim 16, further comprising:
    dividing the block of symbols into two or more segments defined by respective stored reference vectors; and
    re-calculating the first state metric vector for the two or more segments based on the respective stored reference vectors.

21. A method according to claim 20, wherein re-calculating for the two or more segments comprises re-calculating state metrics for some of the two or more segments.

22. A method according to claim 20, comprising storing a re-calculated reference vector of the re-calculated state metric.

23. A method according to claim 22, comprising storing the vectors of the re-calculated state metrics of a segment of the two or more segments.

24. A decoder comprising:
- a backward calculation unit to calculate state metric vectors from a block of symbols in a predetermined direction; and
- a memory having a first storage area to store a reference vector of the calculated state metric vectors and a second storage area to store at least some calculated state metric vectors which are re-calculated from the block of symbols in the predetermined direction based on the stored reference vector.

25. The decoder of claim 24, wherein a maximal storage space of the memory is able to store less than fifty percent of a predetermined number of state metric vectors.

26. The decoder of claim 24, wherein the maximal storage space of the memory is able to store less than twenty percent of the predetermined number of state metric vectors.

27. The decoder of claim 24, wherein the backward calculation unit implements a plurality of different functions for calculating the state metric vectors.

28. The decoder of to claim 27, wherein the backward calculation unit implements a pair of functions for calculating the state metric vectors and wherein the pair comprise mutual reverse functions.

29. The decoder of claim 24, wherein the first storage area is used to store two or more reference vectors in predetermined intervals and the second storage area is used to store the calculated state metric vectors between two reference vectors.

30. The decoder of claim 29, wherein the first storage area serves also for storing state metric vectors from between two reference vectors.

* * * * *